(12) United States Patent
Park et al.

(10) Patent No.: US 7,606,035 B2
(45) Date of Patent: Oct. 20, 2009

(54) HEAT SINK AND MEMORY MODULE USING THE SAME

(75) Inventors: Chang-Yong Park, Chungcheongnam-do (KR); Yong-Hyun Kim, Gyeonggi-do (KR); Kwang-Ho Chun, Chungcheongnam-do (KR); Hyun-Jong Oh, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 46 days.

(21) Appl. No.: 11/859,564

(22) Filed: Sep. 21, 2007

(65) Prior Publication Data

US 2008/0074848 A1  Mar. 27, 2008

(30) Foreign Application Priority Data

Sep. 22, 2006 (KR) .................. 10-2006-0092453

(51) Int. Cl.
*H05K 7/20* (2006.01)
*F28F 7/00* (2006.01)

(52) U.S. Cl. ............. 361/715; 361/707; 361/719; 361/728; 361/737; 165/80.3; 165/104.33; 165/185; 174/16.3

(58) Field of Classification Search ........... 361/690, 361/703–712, 715–720, 816; 165/80.2, 80.3, 165/80.4, 104.33, 185; 257/706–709, 712–713, 257/717–722, 726–727; 174/15.1, 16.3, 174/252; 248/505, 510; 29/832, 835, 840, 29/842
See application file for complete search history.

(56) References Cited

U.S. PATENT DOCUMENTS

| | | | | |
|---|---|---|---|---|
| 5,109,318 A | * | 4/1992 | Funari et al. | 361/710 |
| 6,088,228 A | * | 7/2000 | Petersen et al. | 361/720 |
| 6,181,561 B1 | * | 1/2001 | Albrecht et al. | 361/719 |
| 6,233,150 B1 | * | 5/2001 | Lin et al. | 361/704 |
| 6,297,966 B1 | * | 10/2001 | Lee et al. | 361/799 |
| 6,343,020 B1 | * | 1/2002 | Lin et al. | 361/816 |
| 6,362,966 B1 | * | 3/2002 | Ali et al. | 361/728 |
| 6,370,027 B1 | * | 4/2002 | Koizumi et al. | 361/720 |

(Continued)

FOREIGN PATENT DOCUMENTS

JP      2003-017634      1/2003

(Continued)

OTHER PUBLICATIONS

English language abstract of Korean Publication No. 2001-0056373.

(Continued)

*Primary Examiner*—Michael V Datskovskiy
(74) *Attorney, Agent, or Firm*—Marger Johnson & McCollom, P.C.

(57) ABSTRACT

Provided are a heat sink and a memory module using the heat sink. In one embodiment, the heat sink includes a first and second guide pin respectively disposed in first and second heat spreaders placed around an object to be cooled. The first and second guide pins help prevent misalignment problems from occurring between the first and second heat spreaders, as well as helping prevent the first and second heat spreaders from contacting each other when the first and second heat spreaders are pressed by pressure applied from the outside.

23 Claims, 7 Drawing Sheets

U.S. PATENT DOCUMENTS

| | | | |
|---|---|---|---|
| 6,377,460 B1 * | 4/2002 | Pohl et al. | 361/704 |
| 6,483,702 B1 * | 11/2002 | Lofland | 361/704 |
| 6,765,797 B2 * | 7/2004 | Summers et al. | 361/704 |
| 7,023,700 B2 * | 4/2006 | Chiou et al. | 361/704 |
| 7,190,595 B2 * | 3/2007 | Chang | 361/816 |
| 7,221,569 B2 * | 5/2007 | Tsai | 361/704 |
| 7,312,996 B2 * | 12/2007 | Chang | 361/704 |
| 7,349,220 B2 * | 3/2008 | Lai et al. | 361/719 |
| 7,365,985 B1 * | 4/2008 | Ni | 361/715 |
| 7,375,964 B2 * | 5/2008 | Lai et al. | 361/704 |
| 7,382,617 B2 * | 6/2008 | Yu et al. | 361/704 |
| 7,391,613 B2 * | 6/2008 | Lai et al. | 361/700 |
| 7,400,506 B2 * | 7/2008 | Hoss et al. | 361/715 |
| 7,457,122 B2 * | 11/2008 | Lai et al. | 361/704 |
| 2006/0268524 A1 * | 11/2006 | Uehara et al. | 361/715 |

FOREIGN PATENT DOCUMENTS

| | | |
|---|---|---|
| KR | 2001-0056373 | 7/2001 |
| KR | 20-0325122 | 8/2003 |

OTHER PUBLICATIONS

English language abstract of Korean Publication No. 20-0325122.
English language abstract of Japanese Publication No. 2003-017634.

* cited by examiner

HEAT SINK AND MEMORY MODULE USING THE SAME

CROSS-REFERENCE TO RELATED PATENT APPLICATION

This application claims the benefit of Korean Patent Application No. 10-2006-0092453, filed on Sep. 22, 2006 in the Korean Intellectual Property Office, the disclosure of which is incorporated herein by reference.

BACKGROUND

1. Field of the Invention

The present invention relates to a heat sink and a memory module using the heat sink, and more particularly, to a heat sink that can be applied to a semiconductor package, and a memory module using the heat sink.

2. Description of the Related Art

In general, the driving speed of a semiconductor package, for example, a ball array semiconductor package, is high resulting in a substantial amount of heat radiation. To maintain performance this heat generated in the semiconductor package must be dissipated. Also in general, a memory module in which a plurality of semiconductor packages (semiconductor chips) are mounted on a printed circuit board (PCB) is used to increase memory capacity. Thus, since the packages of the memory module generate a lot of heat, a heat sink is generally used to dissipate heat to the outside.

The heat sink includes a first heat spreader formed as a thin layer on an upper surface of the PCB on which the plurality of semiconductor packages are mounted, and a second heat spreader formed on a rear surface of the PCB on which the plurality of semiconductor packages are mounted. The first and second heat spreaders face and contact the plurality of semiconductor packages mounted on the PCB to transfer the generated heat to the outside.

However, in a conventional heat sink, when the first heat spreader formed on the surface of the PCB and the second heat spreader formed on the rear surface of the PCB are coupled, a misalignment is commonly generated between the first heat spreader and the second heat spreader making automation very difficult.

In addition, the first and second heat spreaders are pressed against each other in the conventional heat sink when pressure is applied from the outside. Thus the first or second heat spreader contacts a circuit element formed on the PCB, for example, a capacitor, thereby generating a short circuit.

SUMMARY

Embodiments of the present invention provide a heat sink that enables an automation process for coupling heat spreaders by preventing misalignment between heat spreaders. In addition, these embodiments prevent contact between the heat spreaders and a circuit element formed on a printed circuit board (PCB) can be prevented when pressure is applied from the outside.

Additional embodiments of the present invention provide a memory module using the heat sink described above.

According to an embodiment of the present invention, a heat sink includes a first heat spreader, a second heat spreader, a first guide pin, a second guide pin, and a coupling unit. The first heat spreader faces and contacts a first component disposed on a first surface of an object to be cooled and directs heat away from the first component. The second heat spreader is disposed on a second surface of the object to be cooled. The second heat spreader faces and contacts a second component to direct heat away from the second component.

The first guide pin is disposed in a first extension portion near both edges of the first heat spreader, inserted and fixed in an insertion hole corresponding to the first extension portion, and installed in the object to be cooled. The second guide pin faces the first guide pin and is disposed in a second extension portion near both edges of the second heat spreader. The second guide pin is inserted and fixed in the insertion hole corresponding to the second extension portion and is installed in the object to be cooled. The coupling unit closely adheres and couples the first and second heat spreaders to the object to be cooled.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Heat Sink

Embodiment 1

Figure 1:
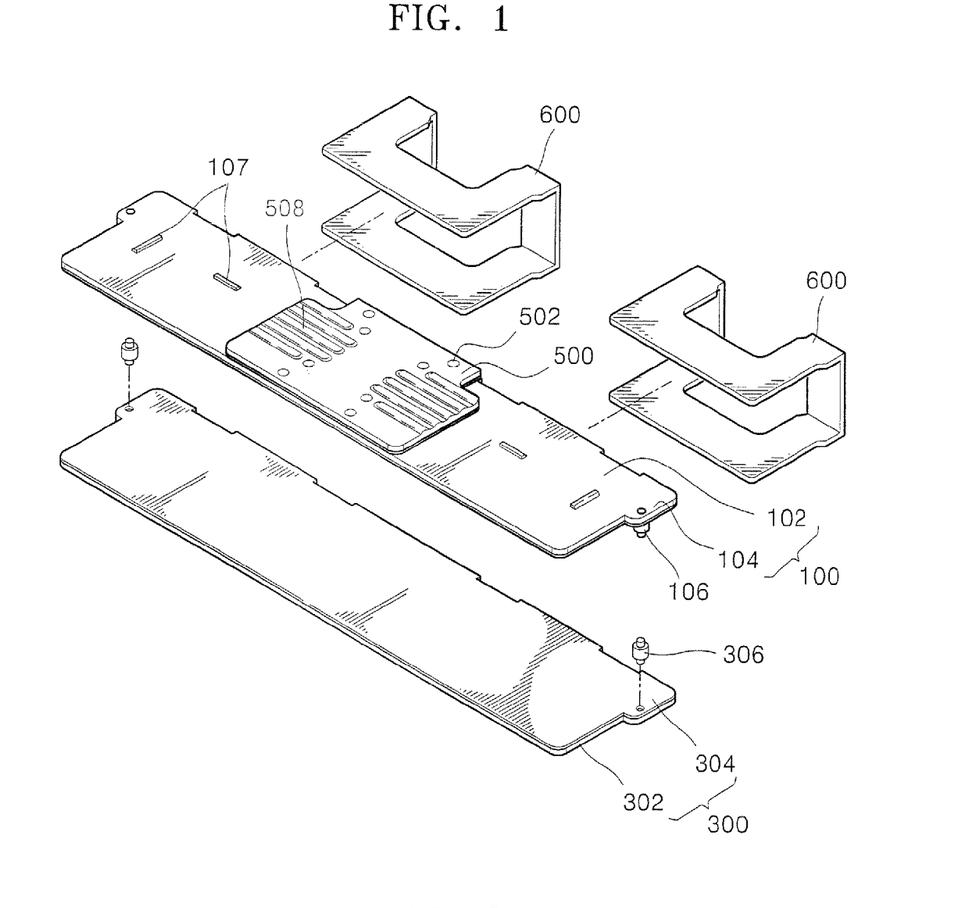
FIG. 1 is a dissected perspective view illustrating a heat sink according to an embodiment of the present invention.
Figure 2:
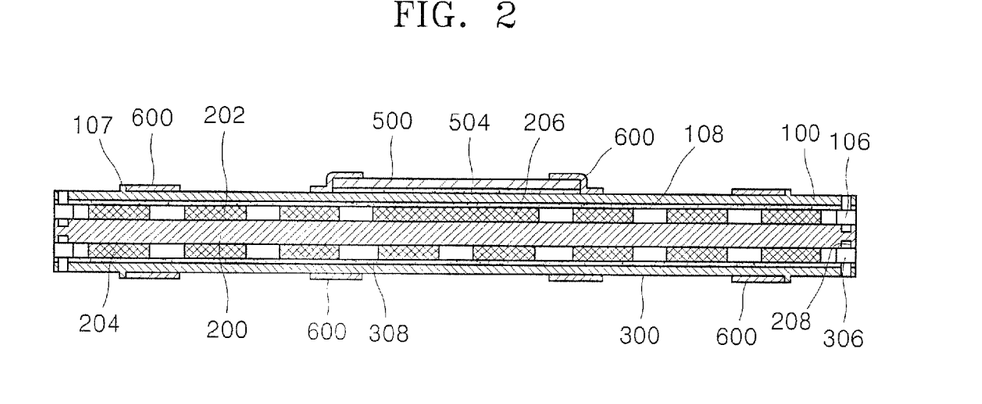
FIG. 2 is a cross-sectional view illustrating the heat sink illustrated in FIG. 1, according to an embodiment of the present invention.

FIG. 1 is a dissected perspective view illustrating a heat sink according to an embodiment of the present invention. FIG. 2 is a cross-sectional view of the heat sink illustrated in FIG. 1, according to an embodiment of the present invention.

Referring to FIGS. 1 and 2, the heat sink includes a first heat spreader 100, a second heat spreader 300, a third heat spreader 500 disposed on the first heat spreader 100, a first guide pin 106 and a second guide pin 306 respectively installed on the first and second heat spreaders 100 and 300 and inserted into an object 200 to be cooled, and a coupling unit 502 closely adhering and coupling the first and second heat spreaders 100 and 300 to the object 200 to be cooled.

The first heat spreader 100 is a thin layer facing and contacting a first component 202 disposed on an upper surface of the object 200 to be cooled and directs away heat generated in the first component 202. The second heat spreader 300 is a thin layer facing and contacting a second component 204 disposed on a rear surface of the object 200 to be cooled and directs away heat generated in the second component 204. The third heat spreader 500 is a thin layer disposed above-centered to the object 200 to be cooled, facing and contacting a third component 206 and directs away heat generated in the third component 206.

The first and second components 202 and 204 generate heat at a lower temperature than the third component 206. Since the first and second heat spreaders 100 and 300 may have a lower heat generation efficiency than the third heat spreader 500, the first and second heat spreaders 100 and 300 are formed of a material having a first heat transfer coefficient of about 238 W/mK, for example, aluminum. The third heat spreader 500 is formed of a material having a second heat transfer coefficient of about 397 W/mK, for example, copper.

In other words, the second heat transfer coefficient of the third heat spreader 500 is greater than the first heat transfer coefficient of the first and second heat spreaders 100 and 300. In order to increase the surface area of heat dissipation, a plurality of grooves 508 are formed on the upper surface of the third heat spreader 500.

The first and third heat spreaders 100 and 500 are coupled by a coupling unit 502 through a compression process or a welding method. In addition, in order for the intense heat in the first through third components 202, 204, and 206 to be rapidly transferred to the first through third heat spreaders 100, 300, and 500 respectively, thermal interface layers 108, 308, and 504 may be respectively interposed between the first component 202 and the first heat spreader 100, the second component 204 and the second heat spreader 300, and the first heat spreader 100 and the third heat spreader 500. For example, the first through third thermal interface layers 108, 308, and 504 may be formed of a thermally conductive material such as copper.

The first guide pin 106 that is inserted and fixed in an insertion hole 208 of the object 200 to be cooled is installed in the first heat spreader 100. The first guide pin 106 is installed in a first extension portion 104 extending from an inner portion 102 of the first heat spreader 100 near edges of both ends of the first heat spreader 100. The second guide pin 306 is installed in the second heat spreader 300 and inserted and fixed in the insertion hole 208 of the object 200 to be cooled.

The insertion hole 208 of the object 200 to be cooled may pass through the object 200 to be cooled or not. The second guide pin 306 is installed in a second extension portion 304 extending from an inner portion 302 near edges of both ends of the second heat spreader 300. The cross-section of the first and second guide pins 106 and 306 may be as a cylinder, a V-shape, or a hexahedron depending on the manufacturing method of the first and second guide pins 106 and 306.

The first and second extension portions 104 and 304 do not face and contact the first and second components 202 and 204 of the object 200 to be cooled, and are disposed in a corresponding position with the insertion hole 208 of the object 200 to be cooled. The first and second guide pins 106 and 306 may be pen pins that are respectively formed for the first heat spreader 100 and the second heat spreader 300 through a compression process. The compression process for manufacturing the first and second guide pins 106 and 306 will be described later in more detail.

The first guide pin 106 and the second guide pin 306 are inserted and fixed in the insertion hole 208 of the object 200 to be cooled. When the first and second guide pins 106 and 306 are inserted and fixed in the insertion hole 208 of the object 200 to be cooled, the first and second heat spreaders 100 and 300 are effectively prevented from contacting the object 200 to be cooled when the first and second heat spreaders 100 and 300 are pressed by pressure applied from the outside.

In particular, the first guide pin 106 and the second guide pin 306 may be separated a predetermined distance apart from each other in the insertion hole 208 of the object 200 to be cooled and be forcibly inserted. In other words, the first and second guide pins 106 and 306 may both be partially inserted into the insertion hole 208 of the object 200 to be cooled and be forcibly inserted. Thus, when the first and second heat spreaders 100 and 300 are pressed by external pressure, the first and second heat spreaders 100 and 300 can be prevented from contacting the object 200 to be cooled more efficiently.

The first and second guide pins 106 and 306 guide the first and second heat spreaders 100 and 300 when the first and second heat spreaders 100 and 300 are fixed and coupled to the object 200 to be cooled. Thus, the second heat spreader 300 having the second guide pin 306 corresponding to the insertion hole 208 is formed. Then, the object 200 to be cooled is mounted on the second heat spreader 300 such that the insertion hole 208 of the object 200 to be cooled is inserted and fixed to the second guide pin 306 of the second heat spreader 300. Next, the first spreader 100 having the first guide pin 106 corresponding to the second guide pin 306 is safely mounted. The first heat spreader 100 is then fixed and coupled to the insertion hole 208 of the object 200 to be cooled.

Thus, by using the first guide pin 106 and the second guide pin 306 respectively of the first and second heat spreaders 100 and 300, all the processes of fixing and coupling the first heat spreader 100 and the second heat spreader 300 to the object 200 to be cooled can be carried out by an automation process.

A coupling unit 600 that closely adheres and couples the first and second heat spreaders 100 and 300 to the object 200 to be cooled is installed on the heat sink according to the current embodiment of the present invention. The coupling unit 600 may be an elastic clip and is installed on a rear surface of the first and second heat spreaders 100 and 300. The coupling unit 600 may also be securely coupled to a fixing portion 107 disposed on the first heat spreader 100. Due to the coupling unit 600, the formation of a space between the first through third components 202, 204, and 206 and the object 200 to be cooled is prevented.

Embodiment 2

Figure 3:
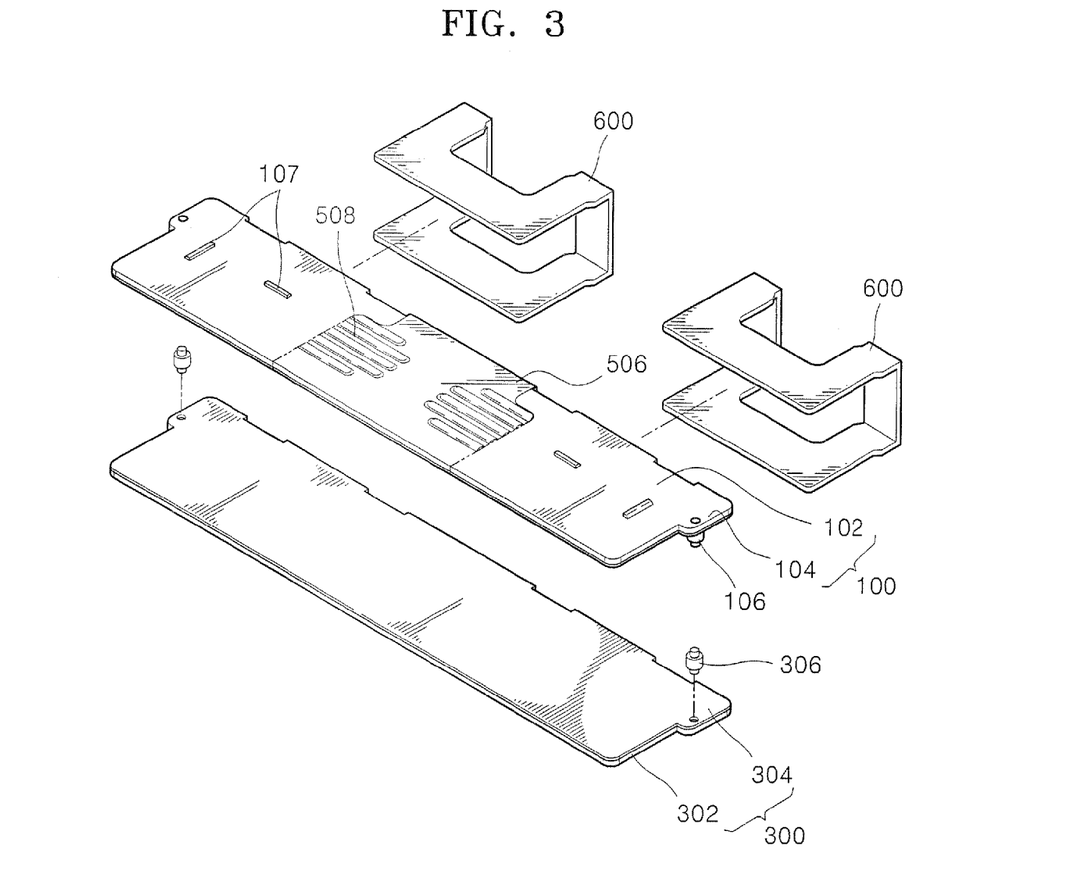
FIG. 3 is a dissected perspective view illustrating a heat sink according to another embodiment of the present invention.
Figure 4:
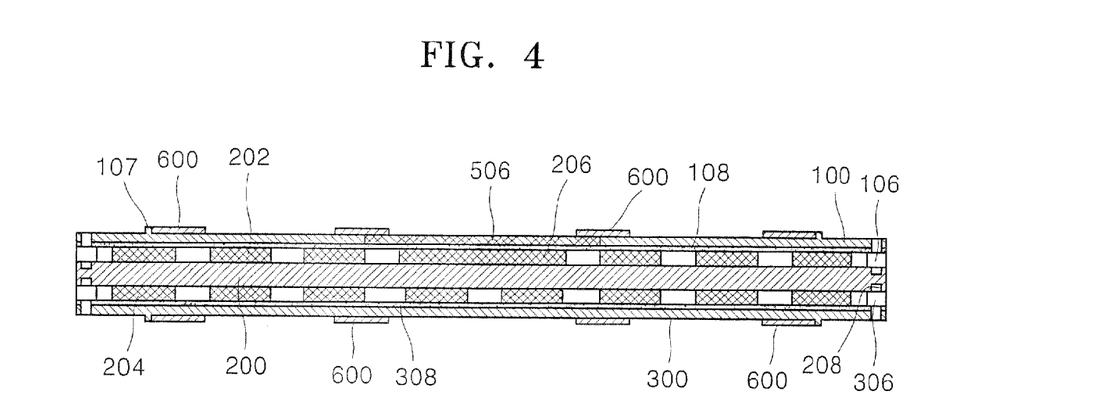
FIG. 4 is a cross-sectional view of the heat sink illustrated in FIG. 3, according to an embodiment of the present invention.

FIG. 3 is a dissected perspective view illustrating a heat sink according to another embodiment of the present invention. FIG. 4 is a cross-sectional view of the heat sink illustrated in FIG. 3, according to an embodiment of the present invention.

In detail, the heat sink according to the current embodiment of the present invention is substantially the same as the heat sink of FIG. 1 except that the third heat spreader 500 (shown in FIG. 2) is not installed on the surface of the first heat spreader 100. In FIGS. 3 and 4, the reference numerals identical to those of FIGS. 1 and 2 refer to identical components, and descriptions of the identical components, for example, the connection relationship and the effects, will be omitted.

Referring to FIGS. 3 and 4, even though the third heat spreader 500 is not installed in a center portion 506 on the surface of the first heat spreader 100, the heat sink of the current embodiment of the present invention can easily emit heat generated in first through third components 202, 204, 206 to the outside even with the absence of the third heat spreader 500. In FIGS. 3 and 4, a plurality of grooves 508 are formed on the upper surfaces of the first heat spreader 100.

As such, the manufacturing process for the third heat spreader 500 can be omitted in the current embodiment of the present invention. A coupling unit 600, e.g., an elastic clip, may again be used to closely adhere and couple the first and second heat spreaders 100 and 300 to the first through third components 202, 204, and 206.

Embodiment 3

Figure 5:
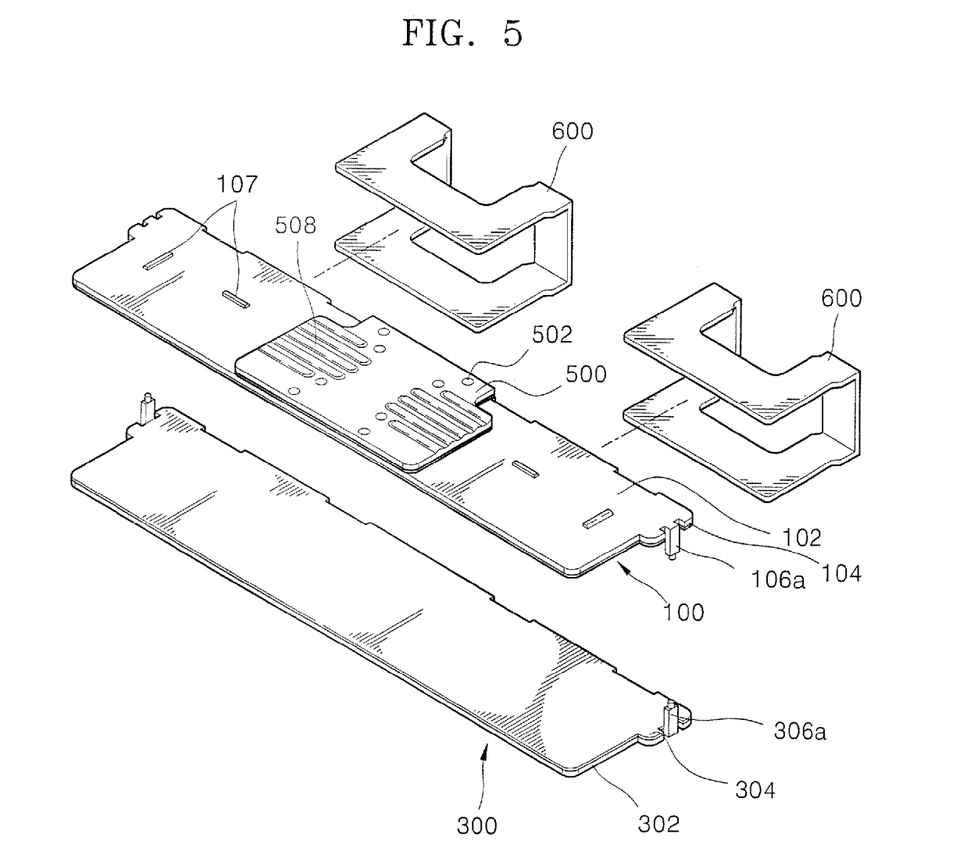
FIG. 5 is a dissected perspective view illustrating a heat sink according to another embodiment of the present invention.
Figure 6:
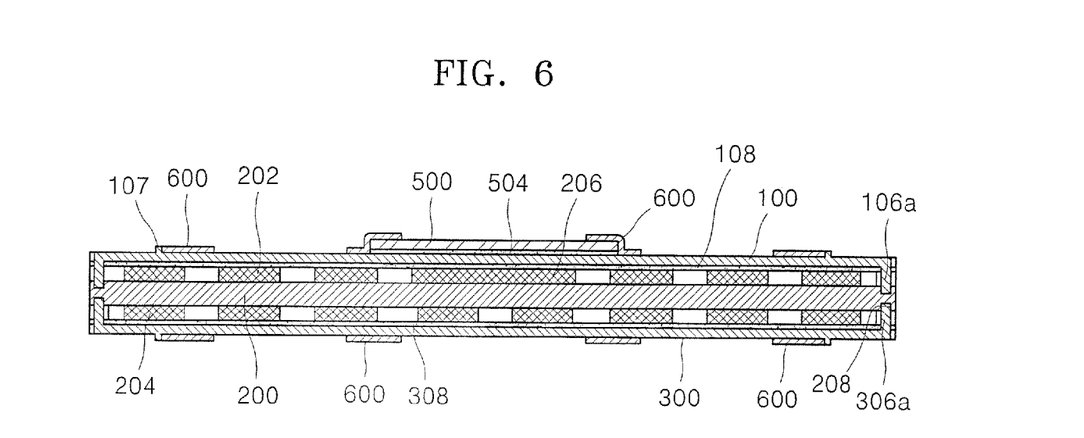
FIG. 6 is a cross-sectional view of the heat sink illustrated in FIG. 5, according to an embodiment of the present invention.

FIG. 5 is a dissected perspective view illustrating a heat sink according to another embodiment of the present invention. FIG. 6 is a cross-sectional view of the heat sink illustrated in FIG. 5, according to an embodiment of the present invention.

In detail, the heat sink according to the current embodiment of the present invention is substantially identical to the heat sink of FIG. 1 except that first and second guide pins 106a and 306a of the current embodiment have a different shape than the first and second guide pins 106 and 306 of the heat sink of FIG. 1. In FIGS. 5 and 6, the reference numerals identical to those of FIGS. 1 and 2 refer to identical components, and descriptions of the identical components, for example, the connection relationship and the effects, will be omitted. In addition, a third heat spreader 500 is included in FIGS. 5 and 6 but may not be included according to necessity.

Referring to FIGS. 5 and 6, first and second guide pins 106a and 306a according to the current embodiment of the present invention are respectively formed integrally with the first and second heat spreaders 100 and 300 of the heat sink of FIG. 1 and are bent shaped pins.

The first and second guide pins 106a and 306a according to the current embodiment of the present invention do not require a special manufacturing process and can be manufactured using a mold or a metal processing during the manufacture of the first and second heat spreaders 100 and 300 of the heat sink of FIG. 1. Accordingly, the heat sink according to the current embodiment of the present invention can be manufactured in a simple process.

Embodiment 4

Figure 7:
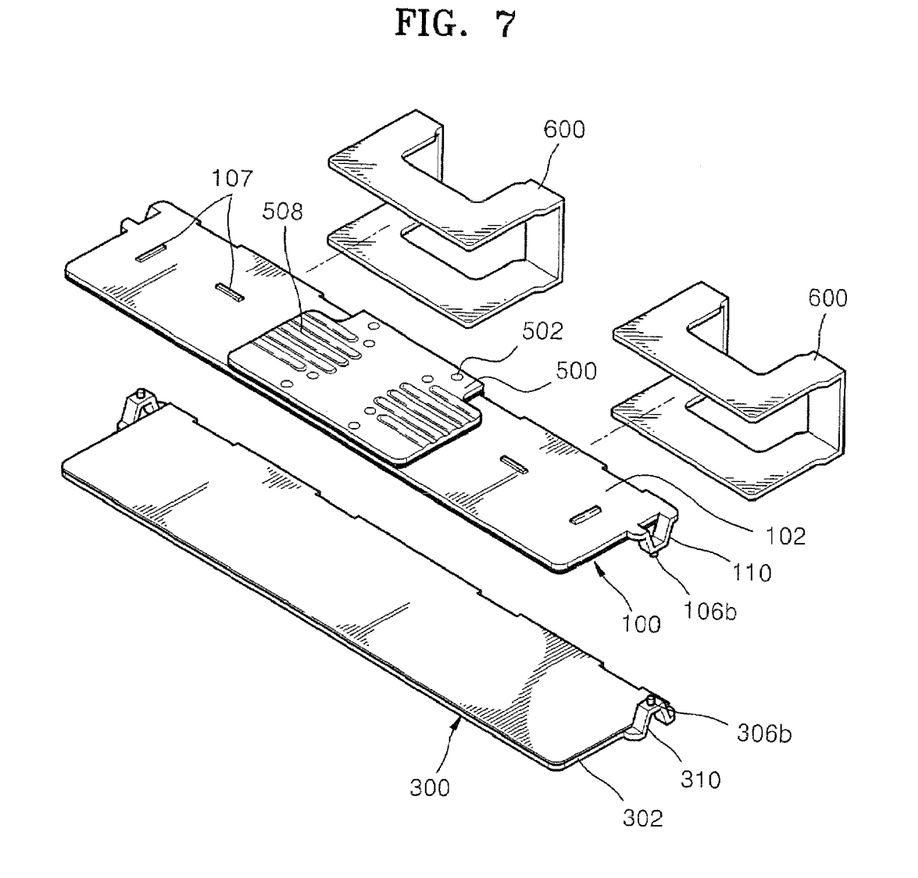
FIG. 7 is a dissected perspective view illustrating a heat sink according to another embodiment of the present invention.
Figure 8:
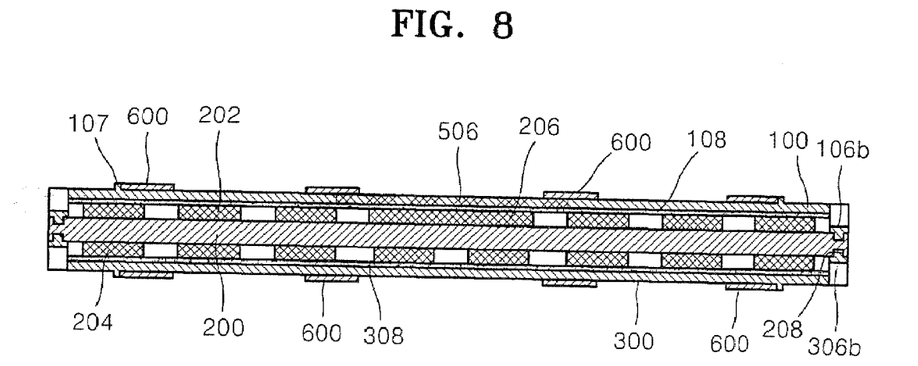
FIG. 8 is a cross-sectional view of the heat sink illustrated in FIG. 7, according to an embodiment of the present invention.

FIG. 7 is a dissected perspective view illustrating a heat sink according to another embodiment of the present invention. FIG. 8 is a cross-sectional view of the heat sink illustrated in FIG. 7, according to an embodiment of the present invention.

In detail, the heat sink according to the current embodiment of the present invention is substantially identical to the heat sink of FIG. 1 except that first and second guide pins 106b and 306b of the current embodiment have a different shape than the first and second guide pins 106 and 306 of the heat sink of FIG. 1. In FIGS. 7 and 8, the reference numerals identical to those of FIGS. 1 and 2 refer to identical components, and descriptions of the identical components, for example, the connection relationship and the effects, will be omitted. In addition, a third heat spreader 500 is included in FIGS. 7 and 8 but may not be included according to necessity.

Referring to FIGS. 7 and 8, the first and second guide pins 106b and 306b according to the current embodiment of the present invention are respectively formed integrally with the first and second heat spreaders 100 and 300 and are bent shaped pins. In addition, first and second guide pin supporting portions 110 and 310 that respectively support first and second guide pins 106b and 306b are included in the current embodiment of the present invention. When the first and second guide pin supporting portions 110 and 310 are included, the first and second guide pins 106b and 306b can be stably formed. Thus, even when first and second heat spreaders 100 and 300 are compressed by large external pressures, the first and second guide pins 106b and 306b may provide more support than the guide pins of the above described embodiments.

The first and second guide pins 106b and 306b and the first and second guide pin supporting portions 110 and 310 according to the current embodiment of the present invention do not require a special manufacturing process and can be manufactured using a mold or a metal processing during the manufacture of the first and second heat spreaders 100 and 300 of the heat sink of FIG. 1. Accordingly, the heat sink according to the current embodiment of the present invention can be manufactured in a simple process.

Embodiment 5

Figure 9:
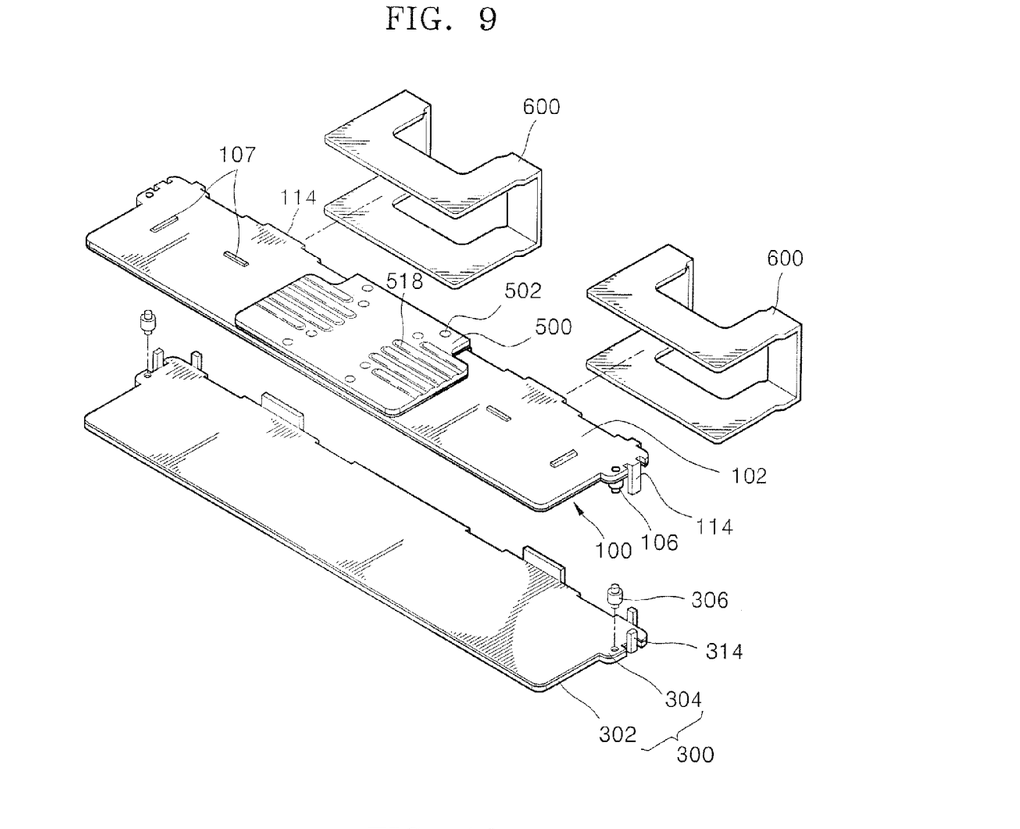
FIG. 9 is a dissected perspective view illustrating a heat sink according to another embodiment of the present invention.
Figure 10:
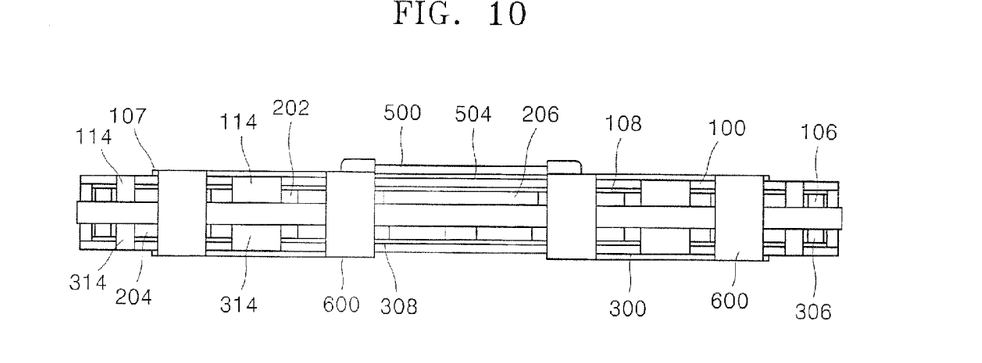
FIG. 10 is a cross-sectional view of the heat sink illustrated in FIG. 9, according to an embodiment of the present invention.

FIG. 9 is a dissected perspective view illustrating a heat sink according to another embodiment of the present invention. FIG. 10 is a cross-sectional view of the heat sink illustrated in FIG. 9, according to an embodiment of the present invention.

In detail, the heat sink according to the current embodiment of the present invention is substantially identical to the heat sink of FIG. 1 except that first and second supporting bars 114 and 314 supporting first and second heat spreaders 100 and 300 are installed. In FIGS. 9 and 10, the reference numerals identical to those of FIGS. 1 and 2 refer to identical components, and descriptions of the identical components, for example, the connection relationship and the effects, will be omitted. In addition, a third heat spreader 500 is included in FIGS. 9 and 10 but may not be included according to necessity.

Referring to FIGS. 9 and 10, the first and second supporting bars 114 and 314 supporting the first and second heat spreaders 100 and 300 may face and contact each other. The first and second supporting bars 114 and 314 may be installed on a rear surface or at a side surface of the first and second heat spreaders 100 and 300. The first and second supporting bars 114 and 314 may be formed to contact the surface of the object 200 to be cooled, or may be separated from the object 200 to be cooled by a predetermined distance of about 0.1 to about 0.3 mm. The first and second supporting bars 114 and 314 and the first and second heat spreaders 100 and 300 may be installed to have a diverse size and shape according to the design of the first and second heat spreaders 100 and 300. Thus, when the first and second supporting bars 114 and 314 supporting the first and second heat spreaders 100 and 300 are installed, the first and second heat spreaders 100 and 300 can be prevented from contacting the object 200 to be cooled even when the first and second heat spreaders 100 and 300 are pressed by external pressure.

The first and second supporting bars 114 and 314 do not require a special manufacturing process and can be manufactured using a mold or a metal processing as the manufacturing of the first and second heat spreaders 100 and 300 of the heat sink of FIG. 1. Accordingly, the heat sink according to the current embodiment of the present invention can be manufactured in a simple process.

As described above, the heat sink may have various configurations according to various embodiments of the present invention. In addition, the components of the heat sink according to the various embodiments of the present invention can also be combined.

Hereinafter, a memory module using the heat sink according to embodiments of the present invention will be described. The printed circuit board (PCB) forming the memory module may correspond to the object to be cooled of the heat sink. Semiconductor packages forming the memory module may correspond to the first through third components disposed on the upper surface or the rear surface of the object that is to be cooled. Hereinafter, a memory module in which the heat sink of FIG. 1 is described. However, the heat sink according to the other embodiments or a combination thereof may also be used by the memory module.

Memory Module

Embodiment 6

Figure 11:
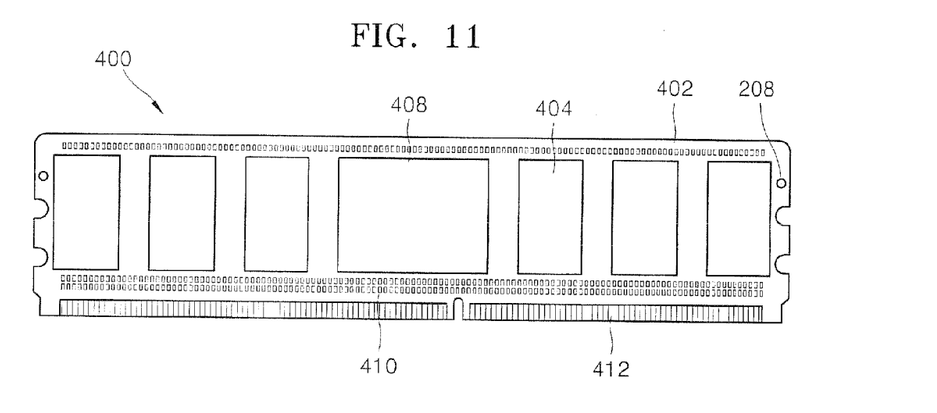
FIG. 11 is a plan view of a memory module employing a heat sink, according to an embodiment in the present invention.
Figure 12:
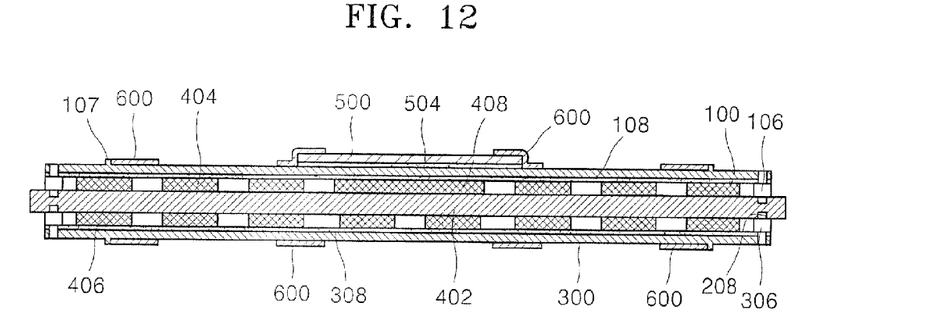
FIGS. 12 and 13 are respectively a cross-sectional view and a perspective view of a memory module employing a heat sink, according to another embodiment of the present invention.
Figure 13:
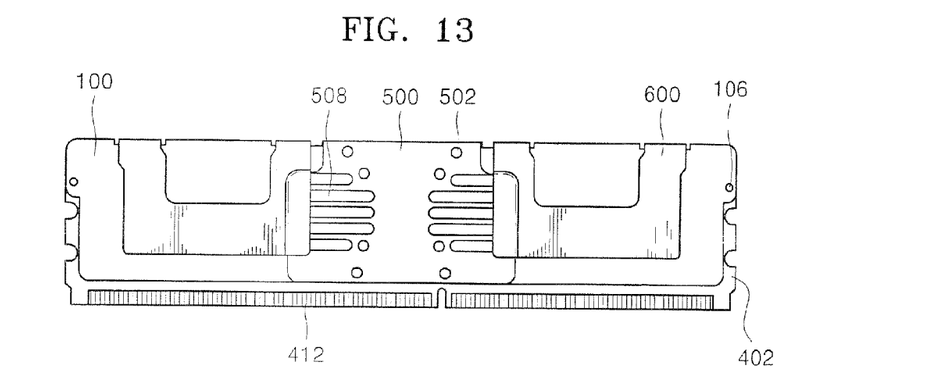

FIG. 11 is a plan view of a memory module 400 employing a heat sink, according to an embodiment of the present invention, and FIGS. 12 and 13 are a cross-sectional view and a perspective view of a memory module employing a heat sink according to another embodiment of the present invention.

A heat sink is formed on an upper surface and a rear surface of the bare memory module 400. The bare memory module 400 includes a plurality of first and second semiconductor packages 404 and 406 (not shown in FIGS. 11 and 13) attached to a PCB 402, an advanced memory buffer (AMB) 408, a circuit element 410, for example, a capacitor, and a contact pad 412 contacting a mother board (not shown).

The bare memory module 400 can be classified as a single in-lined memory module (SIMM) in which semiconductor packages 404 are attached on only one surface of the PCB 402, a dual in-lined memory module (DIMM) in which semiconductor packages 404 and 406 are attached on both sides of the PCB 402, and a fully buffered dual in-lined memory module (FBDIMM) in which AMB 408 is further attached in the center portion of the surface of the PCB 402.

FIGS. 11 through 13 illustrate the FBFIMM as the bare memory module 400. In FIGS. 11 through 13, the number of semiconductor packages attached on the PCB 402 can vary according to the design or the capacity of the memory. In the bare memory module 400, signals from the outside pass through the AMB 408 and are transmitted to the first and second semiconductor packages 404 and 406 in order to increase the transmission efficiency of the bare memory module 400. Thus, a large load is concentrated on the AMB 408, and more intense heat is generated in the AMB 408 than in other first and second semiconductor packages 404 or 406.

In particular, a lot more semiconductor packages can be mounted in the FBDIMM bare memory module 400 to increase the memory capacity and to increase the transmission efficiency of the FBDIMM bare memory module 400. Thus, a non-circuit region is present only near both edges of the PCB 402 where an insertion hole 208 can be formed. The insertion hole 208 may have a diameter of about 1.5 mm. The insertion hole 208 may or may not pass through the object 200 to be cooled. As described with reference to the heat sink of FIG. 1, the first and second guide pins 106 and 306 may be formed in the extension portions 104 and 304 (as shown in FIGS. 1 and 2) near both edges of the first and second heat spreaders 100 and 300. Also, since intense heat may be generated in the AMB 408, a third heat spreader 500 may be needed to emit heat more easily.

Referring to FIGS. 11 and 12, the first semiconductor packages 404 are mounted on the upper surface of the PCB 402. The first semiconductor packages 404 correspond to the first components 202 of the heat sink of FIG. 1. The second semiconductor packages 406 are mounted on a rear surface of the PCB 402. The second semiconductor packages 406 correspond to the second components 204 of the heat sink of FIG. 1. The AMB 408 is mounted in the center portion of the surface of the PCB 402. The AMB 408 corresponds to the third component 206 of the heat sink of FIG. 1.

The first and second semiconductor packages 404 and 406 may include a semiconductor chip, a mold surrounding the semiconductor chip, and solder balls arranged on a rear surface of the mold that are electrically connected to the semiconductor chip. The mold passes the thermal interface layers 108 and 308 to face and contact the first and second heat spreaders 100 and 300. The first and second semiconductor packages 404 and 406 may be a ball grid array (BGA) package, a chip scale package (CSP), a wafer level package (WLP), etc.

The first heat spreader 100 faces and contacts the first semiconductor packages 404 and emits heat from the first semiconductor packages 404. The second heat spreader 300 faces and contacts the second semiconductor packages 406 and emits heat from the second semiconductor packages 406. The first guide pin 106 that is inserted in the insertion hole 208 formed on the PCB 402 is fixed in the first extension portion 104 near both edges of the first heat spreader 100.

Facing the first guide pin 106, the second guide pin 306 that is inserted in the insertion hole 208 is fixed in a second extension portion 304 near both edges of the second heat spreader 300. The first and second extension portions 104 and 304 may not respectively face and contact the first and second semiconductor packages 404 and 406, but may still correspond to the insertion hole 208 of the PCB 402.

The first and second guide pins 106 and 306 may be separated by a predetermined distance from each other in the insertion hole 208 of the PCB 402. The first and second guide pins 106 and 306 may be forcibly inserted and fixed in the insertion hole 208 of the PCB 402. Heat in the AMB 408 is dissipated through the third heat spreader 500 attached to the first heat spreader 100 on the AMB 408. The first heat spreader 100 and the second heat spreader 300 are closely adhered and coupled to the PCB 402 by a coupling unit 600, which may be an elastic clip.

Method of Manufacturing Guide Pins

Figure 14:
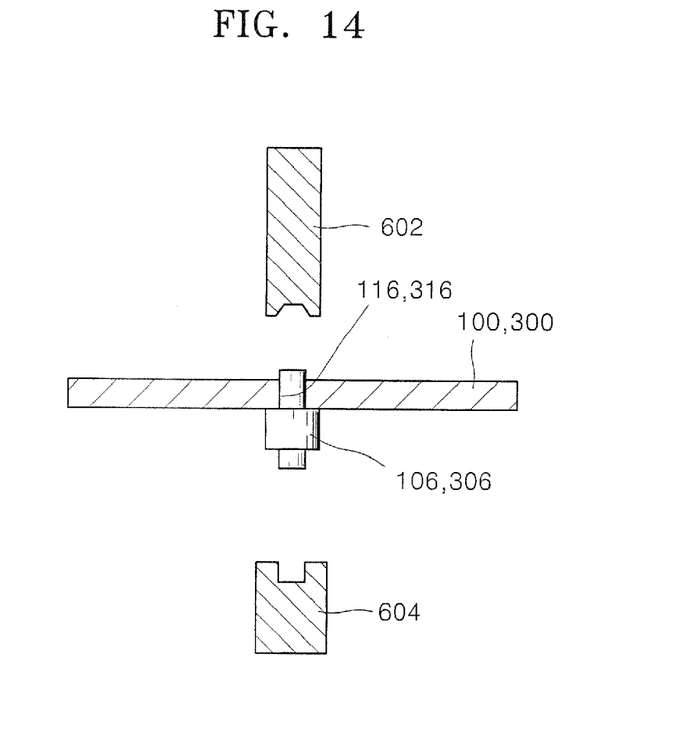
FIGS. 14 and 15 are schematic views illustrating a method of combining guide pins to a heat spreader, according to an embodiment of the present invention.
Figure 15:
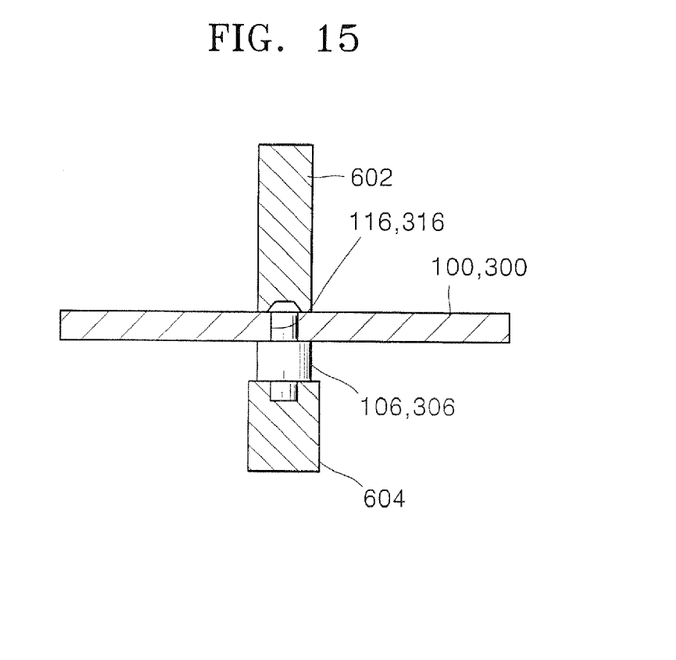

FIGS. 14 and 15 are schematic views illustrating a method of combining guide pins to a heat spreader, according to an embodiment of the present invention.

Referring to FIG. 14, the guide pins 106 or 306, such as pen pins having a diameter of about 1.2 mm, are provided. Then holes 116 or 316 are formed in the heat spreader 100 or 300. The guide pins 106 or 306 are inserted into the holes 116 or 316 of the first or second heat spreaders 100 or 300. The guide pins 106 or 306 that are inserted in the holes 116 or 316 of the first and second heat spreaders 100 and 300 are loaded in a compression processing apparatus having a punch 602 and a die 604.

Referring to FIG. 15, an upper portion of the guide pins 106 or 306 that is inserted in the holes 116 or 316 of the heat spreaders 100 or 300 is processed using the compression processing apparatus. Thus the guide pins 106 or 306 are inserted and fixed in the holes 116 or 316 of the heat spreaders 100 or 300.

While the present invention has been particularly shown and described with reference to exemplary embodiments thereof, it will be understood by those of ordinary skill in the art that various changes in form and details may be made therein without departing from the spirit and scope of the present invention as defined by the following claims.

As described above, a heat sink according to the present invention includes guide pins inserted and fixed in insertion holes which are formed in extension portions near both edges of first and second heat spreaders and installed in an object to be cooled. Thus when the first heat spreader and the second heat spreader are coupled, a misalignment between the first heat spreader and the second heat spreader does not occur, and an automation process is possible.

The heat sink according to the present invention is inserted and fixed in the insertion hole of the object to be cooled, and thus the first and second heat spreaders can be prevented from contacting each other when the first and second heat spreaders are pressed by pressure applied from the outside.

The heat sink according to the present invention may also include a third heat spreader that is attached on the first heat spreader and has an excellent heat transfer coefficient to efficiently emit heat regardless of the amount of heat generated in the object to be cooled.

When the heat sink according to the present invention is employed in a memory module, a misalignment between the first and second heat spreaders is prevented when the first and second heat spreaders that are disposed on an upper surface and a rear surface of a PCB are coupled, and as such, an automation process is possible.

When the heat sink according to the present invention is employed, the first heat spreader or the second heat spreader can be prevented from contacting a circuit element formed on the PCB, for example, a capacitor, when the first and second heat spreaders are pressed by pressure applied from the outside.

What is claimed is:

1. A heat sink comprising:
a first heat spreader facing and contacting a first component disposed on an upper surface of an object to be cooled and emitting heat from the first component;
a second heat spreader disposed on a rear surface of the object to be cooled and facing and contacting a second component to emit heat from the second component;
a first guide pin disposed in a first extension portion near both edges of the first heat spreader, inserted and fixed in an insertion hole corresponding to the first extension portion, and installed in the object to be cooled;
a second guide pin facing the first guide pin, disposed in a second extension portion near both edges of the second heat spreader, inserted and fixed in the insertion hole corresponding to the second extension portion, and installed in the object to be cooled; and
a coupling unit closely adhering and coupling the first and second heat spreaders to the object to be cooled,
wherein the first and second guide pins are bending pins that are formed integrally with the first and second heat spreaders.

2. The heat sink of claim 1, wherein the first and second guide pins are separated a predetermined distance from each other in the insertion hole of the object to be cooled, and are forcibly inserted and fixed in the insertion hole of the object to be cooled.

3. The heat sink of claim 1, wherein the first and second extension portions do not face and contact the first and second components of the object to be cooled and correspond to the insertion hole of the object to be cooled.

4. The heat sink of claim 1, further comprising first and second guide pin supporting portions when the first and second guide pins are bending pins.

5. The heat sink of claim 1, wherein supporting bars are installed to face one another on a rear surface or at a side surface of the first and second heat spreaders to prevent the first and second heat spreaders from contacting the object to be cooled.

6. The heat sink of claim 1, wherein the coupling unit is a clip installed on a rear surface of the first and second heat spreaders.

7. The heat sink of claim 1, wherein thermal interface layers are interposed between the first component and the first heat spreader, and between the second component and the second heat spreader.

8. The heat sink of claim 1, wherein a third heat spreader is further installed on a center portion of the first heat spreader, facing and contacting a third component which generates heat at a higher temperature than the first component.

9. The heat sink of claim 8, wherein the third heat spreader has a higher heat transfer coefficient than the first heat spreader.

10. The heat sink of claim 8, wherein the first and second heat spreaders are formed of aluminum, and the third heat spreader is formed of copper.

11. A memory module comprising:
a printed circuit board (PCB);
a plurality of first semiconductor packages mounted on an upper surface of the PCB;
a plurality of second semiconductor packages mounted on a rear surface of the PCB;
a first heat spreader facing and contacting the plurality of first semiconductor packages and emitting heat from the first semiconductor packages;
a second heat spreader contacting the second semiconductor packages and emitting heat from the second semiconductor packages;
a first guide pin disposed in a first extension portion near both edges of the first heat spreader, inserted and fixed in an insertion hole corresponding to the first extension portion, and installed on the PCB;
a second guide pin disposed in a second extension portion near both edges of the second heat spreader, facing the first guide pin and inserted and fixed in an insertion hole which corresponds to the second extension portion, and installed on the PCB; and a coupling unit closely adhering and coupling the first and second heat spreaders with the PCB, wherein the first and second guide pins are each bending pins formed integrally with the first and second heat spreaders.

12. The memory module of claim 11, wherein the first and second guide pins are separated from each other by a predetermined distance on the PCB and are forcibly inserted in the insertion hole of the PCB.

13. The memory module of claim 11, wherein the first and second extension portions do not face and contact the first and second semiconductor packages and correspond to the insertion hole of the PCB.

14. The memory module of claim 11, further comprising first and second guide pin supporting portions supporting the bending pins acting as the first and second guide pins.

15. The memory module of claim 11, wherein supporting bars are installed to face each other on a rear surface or at a side surface of the first and second heat spreaders such that the first and second heat spreaders do not contact the PCB.

16. The memory module of claim 11, wherein the coupling unit is a clip installed on a rear surface of the first and second heat spreaders.

17. The memory module of claim 11, wherein an advanced memory buffer (AMB) is mounted on a center portion of the surface of the PCB to transmit signals from the outside to the first and second semiconductor packages and to generate heat at a higher temperature than the first and second semiconductor packages.

18. The memory module of claim 17, wherein a third heat spreader is further installed on a center portion of the first heat spreader, facing and contacting the AMB, where the third heat spreader has a higher heat transfer coefficient than the second heat spreader.

19. A heat sink comprising:

a first heat spreader disposed on a first surface of an object to be cooled, the object to be cooled including an insertion hole;

a second heat spreader disposed on a second surface of the object to be cooled;

a first spacer pin fixed in the first heat spreader and disposed in the insertion hole of the object to be cooled; and a second spacer pin fixed in the second heat spreader and disposed in the insertion hole of the object to be cooled, wherein the first and second spacer pins are configured to prevent the first heat spreader and the second heat spreader from contacting circuit structures mounted on the object to be cooled, wherein the first and second spacer pins are bending pins integrally formed with the first and second heat spreaders, respectively.

20. The heat sink of claim 19, further comprising a coupling unit configured to couple the first and second heat spreaders to the object to be cooled.

21. The heat sink of claim 19, further comprising first and second spacer pin supporting portions.

22. The heat sink of claim 19, wherein the first and second spacer pins are further configured to prevent the first heat spreader from contacting the second heat spreader.

23. The heat sink of claim 19, wherein the first and second spacer pins each comprise a first portion fixed to the respective heat spreader, a second portion extending toward the object to be cooled, and a third portion inserted into the insertion hole of the object to be cooled, where a cross-sectional area of the third portion is smaller than a cross-sectional area of the second portion to prevent the respective heat spreader from contacting circuit structures mounted on the object to be cooled.

* * * * *

UNITED STATES PATENT AND TRADEMARK OFFICE
CERTIFICATE OF CORRECTION

| | | |
|---|---|---|
| PATENT NO. | : 7,606,035 B2 | Page 1 of 1 |
| APPLICATION NO. | : 11/859564 | |
| DATED | : October 20, 2009 | |
| INVENTOR(S) | : Chang-Yong Park et al. | |

It is certified that error appears in the above-identified patent and that said Letters Patent is hereby corrected as shown below:

Column 2, line 20, the word "which." should read -- which: --.

Signed and Sealed this

Second Day of March, 2010

David J. Kappos
*Director of the United States Patent and Trademark Office*